United States Patent [19]

Mayes et al.

[11] Patent Number: 5,218,362

[45] Date of Patent: Jun. 8, 1993

[54] MULTISTEP ANALOG-TO-DIGITAL CONVERTER WITH EMBEDDED CORRECTION DATA MEMORY FOR TRIMMING RESISTOR LADDERS

[75] Inventors: Michael K. Mayes, Sunnyvale; Sing W. Chin, Alameda, both of Calif.

[73] Assignee: National Semiconductor Corporation, Santa Clara, Calif.

[21] Appl. No.: 908,230

[22] Filed: Jul. 2, 1992

[51] Int. Cl.⁵ .................. H03M 1/06; H03M 1/14
[52] U.S. Cl. .................. 341/121; 341/118; 341/156; 341/120
[58] Field of Search ............... 341/121, 120, 118, 156, 341/159, 155

[56] References Cited

U.S. PATENT DOCUMENTS

| | | | |
|---|---|---|---|
| 3,701,145 | 10/1972 | Bergin | 341/140 |
| 4,612,533 | 9/1986 | Evans | 341/120 |
| 4,875,048 | 10/1989 | Shimizu et al. | 341/156 |
| 4,896,155 | 1/1990 | Craiglow | 341/156 X |
| 4,903,023 | 2/1990 | Evans et al. | 341/118 X |
| 4,903,024 | 2/1990 | Evans et al. | 341/118 X |
| 4,918,449 | 4/1990 | Chin | 341/156 |
| 4,973,974 | 11/1990 | Suzuki | 341/118 |

OTHER PUBLICATIONS

"A Multistep A/D Converter Family with Efficient Architecture"; Michael K. Mayes and Sing W. Chin; IEEE Log No. 8931436; IEEE Journal of Solid-State Circuits, vol. 24, No. 6, Dec. 1989.

*Primary Examiner*—Sharon D. Logan
*Attorney, Agent, or Firm*—Flehr, Hohbach, Test, Albritton & Herbert

[57] ABSTRACT

An analog-to-digital converter (ADC) has at least one resistance ladder circuit for generating a stepped series of reference voltages and set of comparator circuits for comparing an input voltage, or a voltage derived therefrom, with at least a subset of the stepped series of reference voltages. A memory array embedded in the ADC stores a digital value corresponding to each tap point of the resistance ladder and thus to each reference voltage. During a first conversion cycle an estimated conversion value is generated based on comparison of the input voltage with the stepped series of reference voltages. The estimated conversion value corresponds to one of the resistor ladder tap points selected as being closest in voltage to the input voltage. In a second conversion cycle, a derived voltage based on the input voltage of the estimated conversion value, is compared with a smaller range of reference voltages to generate a finer resolution conversion value. In accordance with the present invention, the voltage on one of the two input nodes of the comparators used in the second conversion cycle is adjusted by an amount proportional to the digital value, stored in the ADC's embedded memory, corresponding to the estimated conversion value from the first conversion cycle, thereby correcting for any non-uniformities in the resistances of the resistor ladder.

7 Claims, 10 Drawing Sheets

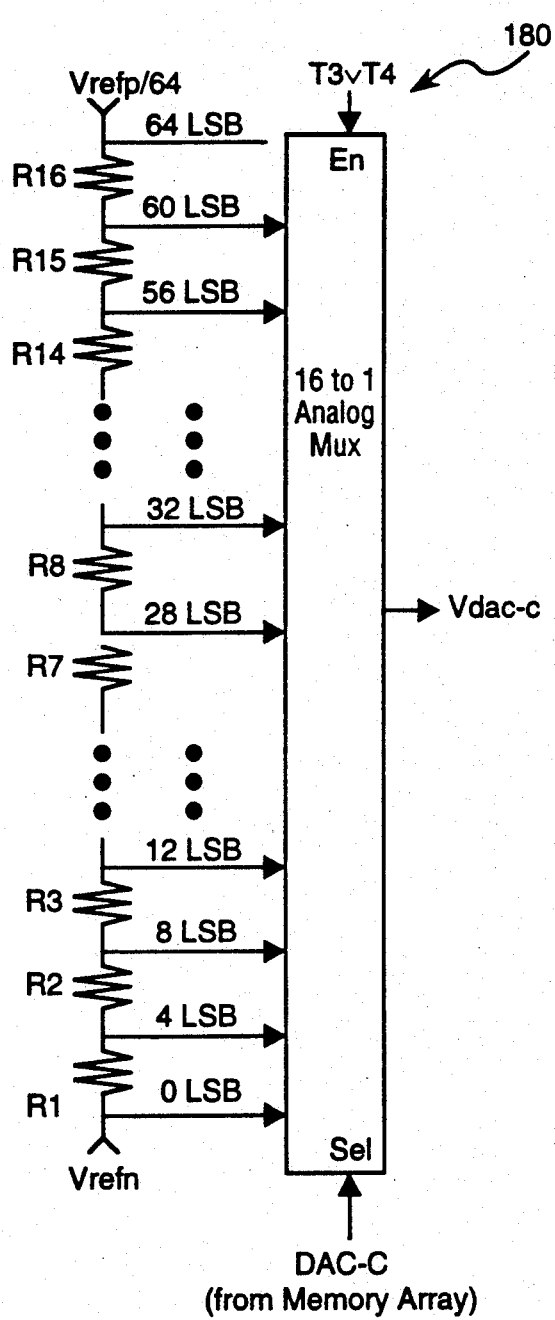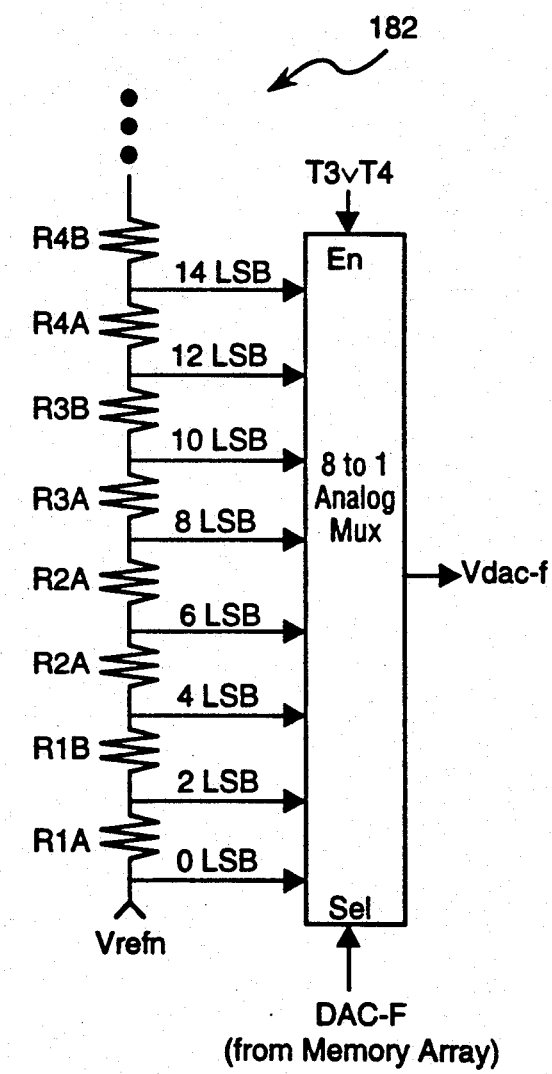
FIGURE 8
FIGURE 9

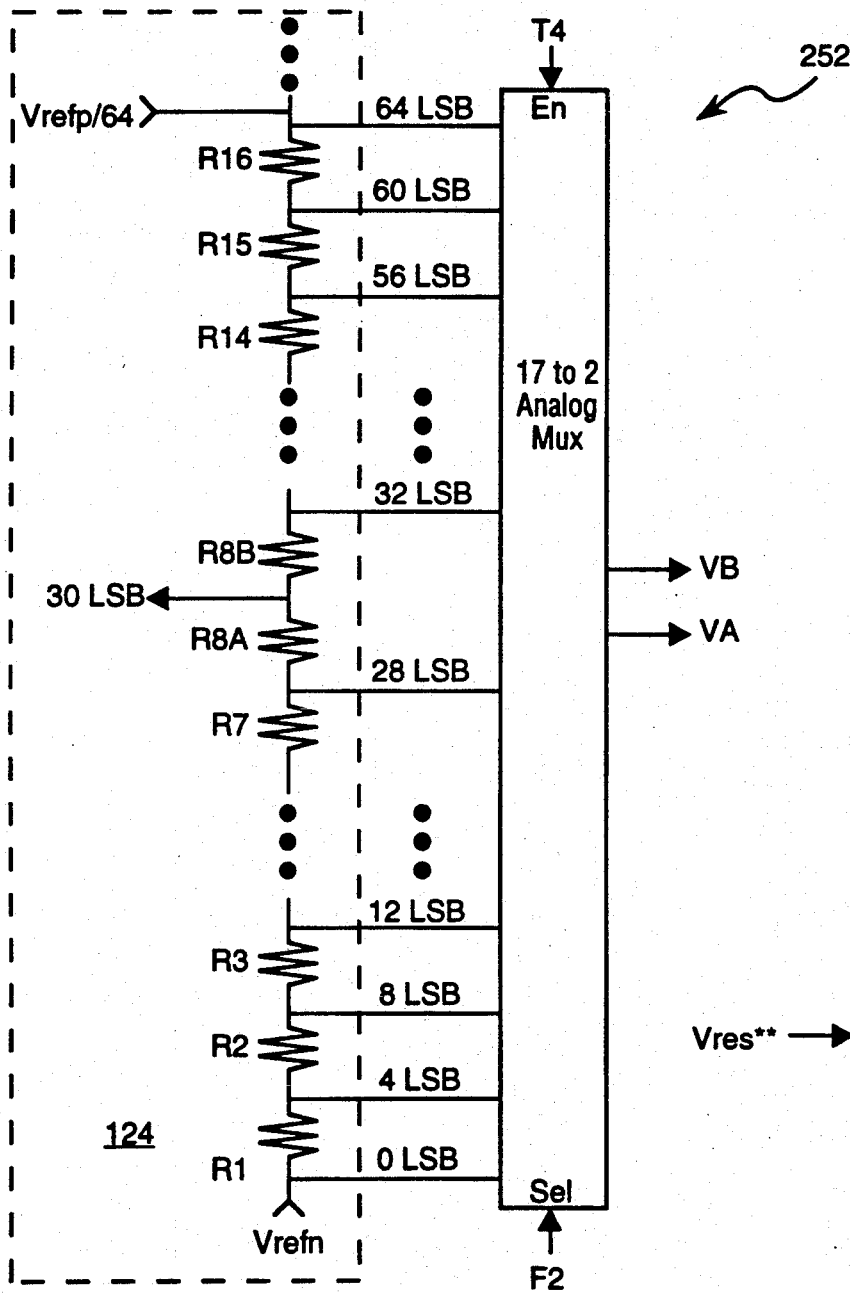
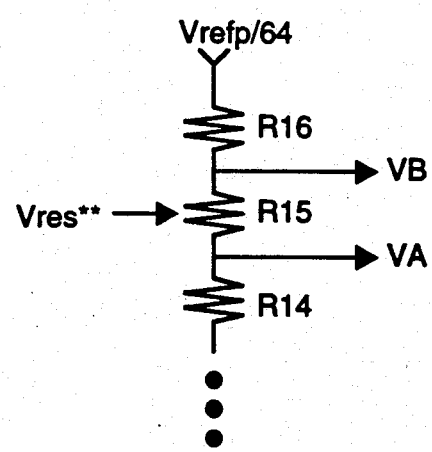
FIGURE 12
FIGURE 13

MULTISTEP ANALOG-TO-DIGITAL CONVERTER WITH EMBEDDED CORRECTION DATA MEMORY FOR TRIMMING RESISTOR LADDERS

The present invention relates generally to analog-to-digital converter (ADC) circuits, and particularly to methods and systems for indirectly correcting for non-linearities in the converter circuit's resistor ladders by storing correction data in an embedded memory array for each step of those resistor ladders, and then using the stored data to linearize the tap point reference voltages produced by the ADC's resistor ladder.

BACKGROUND OF THE INVENTION

A multistep analog-to-digital converter (ADC) is an electronic circuit in which two or more successive conversion cycles are used to compare an input voltage against successively finer ranges of reference voltages in order to produce a high resolution digital representation of the input voltage.

A key element in both flash and multistep ADCs is a resistor ladder that is used to generate a stepped set of reference voltages. Typically, a reference voltage Vref is divided by the resistor ladder by $2^N$ resistors into equal sized voltage steps. The input voltage is then compared with each voltage step, or at least a subset of the voltage steps, in order to determine the magnitude of the input voltage being converted into digital form. The architecture and operation of a multistep ADC will be discussed in much more detail below.

The key point here is that it is very important for all of the $2^N$ resistors in the resistor ladder to be precisely equal in resistance. Especially in multistep ADCs, resistance variations of even 0.025 percent can compromise the linearity and accuracy of a 12-bit ADC. However, the standard semiconductor circuit manufacturing techniques used to manufacture ADCs often produce resistors with resistance mismatches of as much as 0.2 percent. Trimming of resistors using lasers, in order to make resistors of precise resistance, is well known in the art but is not financially feasible for high volume, medium-cost, ADCs. Another technique known in the art to correct for ADC non-linearities is to store a table in memory of correction values, and to then use computer software to adjust each digital value output by the ADC with a corresponding correction value read from the stored table. However this technique is not suitable in many commercial applications, either because a microprocessor or microcontroller is not used in the application, or because the relevant system lacks sufficient memory storage or microprocessor computation cycles to use this technique, or because the technique is insufficiently accurate.

It is the primary object of the present invention to provide an improved ADC circuit that includes an embedded correction memory as well as an associated internal voltage adjustment circuit for "trimming" the effective resistance of the resistors in the ADC's resistor ladder. Another object of the present invention is to increase the resolution of the digital conversion value generated from 10 bits to 12 bits without having to use either an additional resistor ladder or additional comparator circuits.

SUMMARY OF THE INVENTION

In summary, the present invention is used in an analog-to-digital converter (ADC) having at least one resistance ladder circuit for generating a stepped series of reference voltages and set of comparator circuits for comparing an input voltage, or a voltage derived therefrom, with at least a subset of the stepped series of reference voltages. The ADC furthermore includes an embedded memory for storing a digital value corresponding to each tap point of the resistance ladder and thus to each reference voltage. Each of the aforementioned comparator circuits has two input nodes, one of which receives a reference voltage from the resistance ladder and the other of which receives a voltage derived from the input voltage.

During a first conversion cycle an estimated conversion value is generated based on comparison of the input voltage with the stepped series of reference voltages. The estimated conversion value corresponds to one of the resistor ladder tap points selected as being closest in voltage to the input voltage. In a second conversion cycle, a derived voltage based on the input voltage of the estimated conversion value, is compared with a smaller range of reference voltages to generate a finer resolution conversion value. In accordance with the present invention, the voltage on one of the two input nodes of the comparators used in the second conversion cycle is adjusted by an amount proportional to the digital value, stored in the ADC's embedded memory, corresponding to the estimated conversion value from the first conversion cycle, thereby correcting for any non-uniformities in the resistances of the resistor ladder. The first two conversion cycles generate a ten-bit digital value representing the input voltage.

In a third conversion cycle, two additional bits of resolution are added to the conversion value using a "successive approximation" circuit. Furthermore, the third conversion cycle also corrects errors of up to ±6 LSB in the first ten bits of the Fout value. A set of successive comparison voltages are generated in the third conversion cycle by selectively switching combinations of reference voltages with binary weighted capacitors. The resulting comparison voltages are stepped in 1 LSB increments (i.e., the voltage step associated with the least significant bit of the ADC conversion value) and cover a predefined range of voltages above and below the voltage associated with the ten-bit value generated during the first two conversion cycles. Then a voltage derived from the input voltage is compared with the successive comparison voltages to generate a correction value that is combined with the ten-bit value generated during the first two conversion cycles to produce a 12-bit conversion value.

BRIEF DESCRIPTION OF THE DRAWINGS

Additional objects and features of the invention will be more readily apparent from the following detailed description and appended claims when taken in conjunction with the drawings, in which:

FIGS. 8 and 9 show two "inherent" digital-to-analog voltage converters used in the circuit of FIG. 7.

FIGS. 12 and 13 depicts a voltage range selection circuit used in a third conversion cycle of the ADC of FIG. 1.

DESCRIPTION OF THE PREFERRED EMBODIMENT

Figure 1:
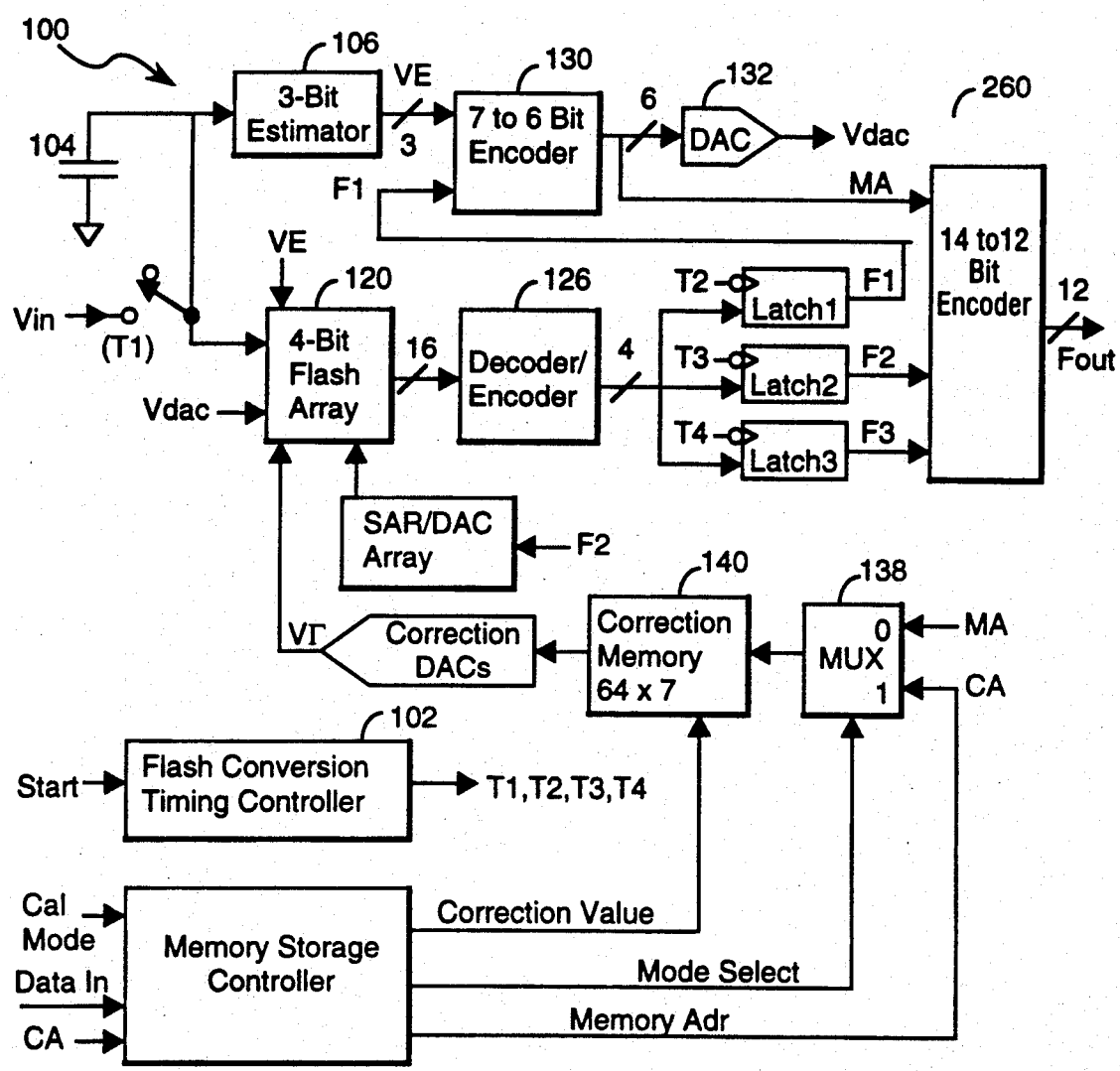
FIG. 1 is a functional block diagram of a preferred embodiment of a multistep analog-to-digital converter.

Referring to FIG. 1, there is shown a block diagram of a preferred embodiment of an analog-to-digital converter (ADC) 100, which is implemented as a single semiconductor integrated circuit. It is important to note that FIG. 1 depicts functional units, and that some circuit components, such as the ADC's main resistor ladder, are shared by multiple ones of these functional units.

Basic Operation of 12-bit Multistep ADC

Figure 2:
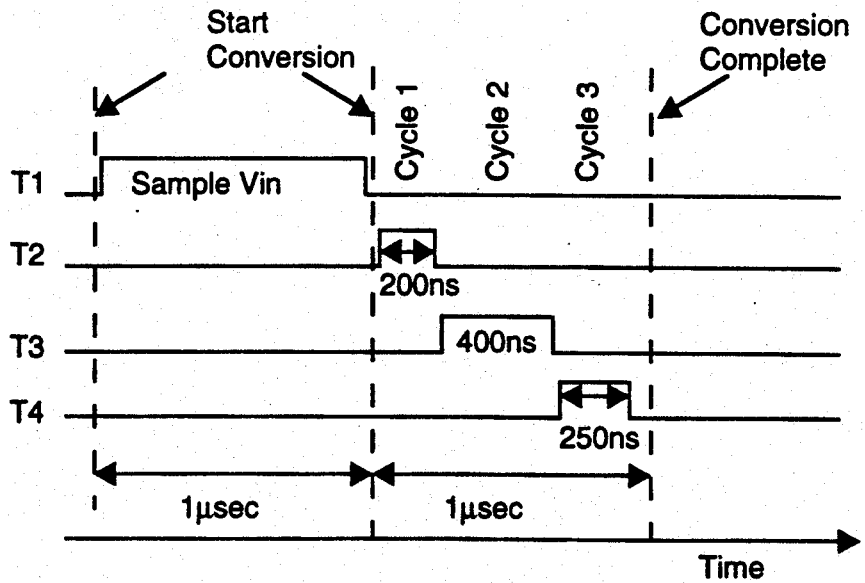
FIG. 2 is a timing diagram of the sampling and conversion cycles of the ADC of FIG. 1.

The ADC 100 receives an input voltage Vin and begins conversion of that voltage into a digital value upon receiving a Start Conversion signal, which triggers the ADC's timing controller 102. The timing controller 102 generates timing signals T1, T2, T3 and T4 that control operation of the ADC's various circuits. A related timing diagram is shown in FIG. 2. When the conversion process is complete, the circuit generates a twelve bit value Fout that represents the digital value of the input voltage, relative to the voltage range between reference voltages Vrefp and Vrefn, with an accuracy of 0.5 LSB, where $$1\ LSB = \frac{(Vrefp - Vrefn)}{4096}$$

1 LSB is the voltage step associated with the least significant bit of the ADC conversion value. For the purposes of describing the operation of the ADC 100, we will assume that Vrefp=5.00 volts, that Vrefn=0.00 volts, and that 1 LSB≅1.22 millivolts. However, the invention is equally applicable when used with other reference voltage ranges, and also to ADCs having a different number of output bits.

In the following discussions regarding each phase of the ADC's operation, reference will be made both to function diagram in FIG. 1 and the specific circuitry shown in other ones of the Figures.

Vin Sampling Period

Figure 3:
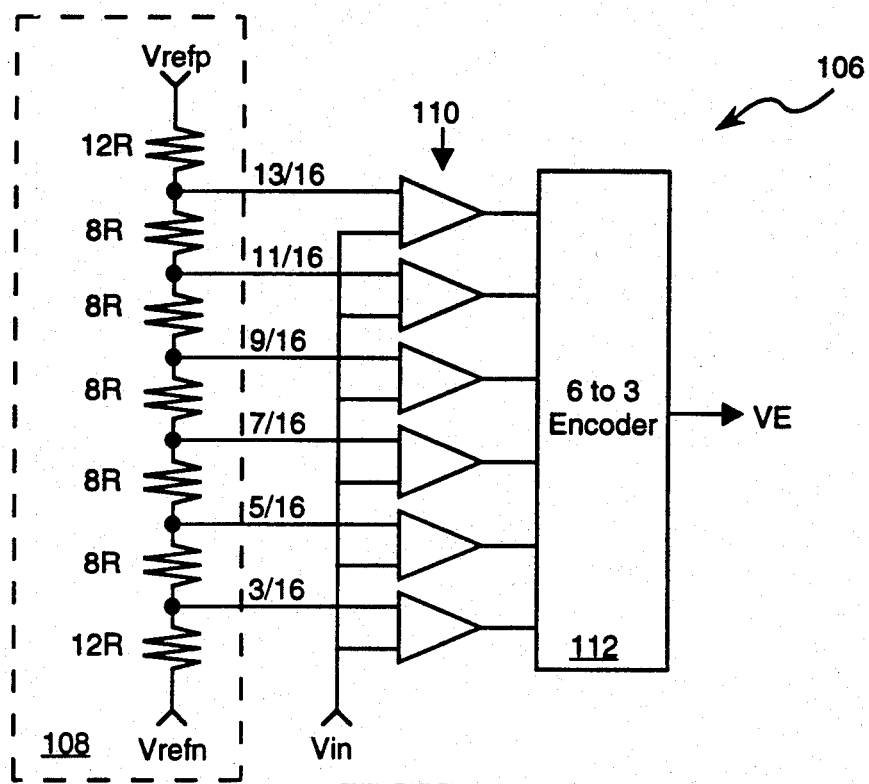
FIG. 3 is a circuit schematic of an input voltage range estimator circuit.

During time period T1, the input signal Vin is sampled and stored on capacitor 104, and a 3-bit estimated value VE is generated by a 3-bit estimator circuit 106. Referring to FIG. 3, the voltage estimator 106, whose operation overlaps with the input signal sampling period T1, determines a rough range in which Vin resides. More particularly, the voltage estimator includes a resistor ladder 108 with six taps positioned to produce six reference voltage levels, 3/16 Vrefp to 13/16 Vrefp, between Vrefp and Vrefn. A set of six comparators 110 compare the six reference voltages with Vin. The six binary outputs from the comparators 110 are converted into a three bit value VE by encoder 112. In particular, the six comparator outputs can have a total of seven possible values (111111, 111110, ... 000000, where the leftmost bit corresponds to the highest comparison voltage), which are mapped into 3-bit values 000 to 110.

First Conversion Cycle

Figure 4:
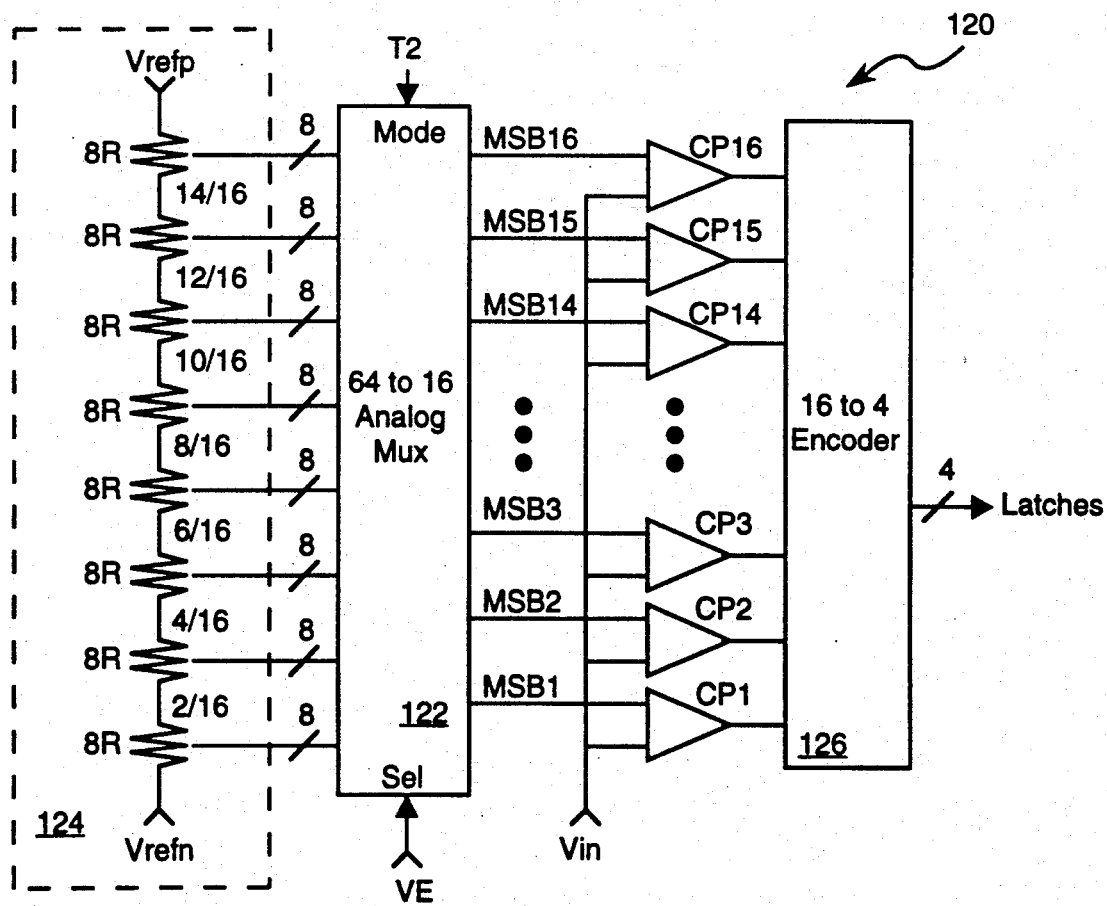
FIG. 4 depicts voltage range selection circuitry and a 4-bit flash array used in the ADC of FIG. 1 in its first conversion cycle.

Referring to FIG. 1 and 4, the 4-Bit flash array 120 is used during each of the three conversion cycles. At the beginning of the first ADC conversion cycle, during which T2 is active, the VE value from the voltage estimator 106 is used in conjunction with a 64-to-16 Analog Multiplexer 122 to select sixteen of the sixty-four reference voltages produced by a 64-resistor ladder 124. As shown in FIG. 4, the sixty-four reference voltages are divided into eight groups of eight, and two contiguous groups of eight are selected based on the value of VE. The sixteen selected reference voltages, labelled MSB1 to MSB16, are compared by sixteen comparators CP1 to CP16 with Vin.

More particularly, as will be discussed below with reference to FIG. 7, the comparators CPi use switch capacitors to add a 0.5 LSB offset to the voltage comparison performed in the first conversion cycle, so that the comparison performed by each comparator CPi is as follows:

$$MSBi - Vin - 0.5\ LSB > 0$$

which can be rewritten as:

$$MSBi - 0.5\ LSB > Vin$$

The reason for the half LSB offset is that the standard specification for ADC circuits is that the digital output value should shift from one value to the next when the input voltage passes the halfway point between the two. For instance, the digital output value of the ADC switches from 0 to 1 when the input voltage Vin rises above 0.5 LSB.

The sixteen comparator outputs can have a total of seventeen possible output values (111 ... 111, 111 ... 110, ..., 000 ... 000, where the leftmost bit corresponds to comparator circuit CP 16 and the rightmost bit corresponds to comparator circuit CP1), the last of which is an "illegal value" because it indicates that Vin is above the range of voltage selected by the 3-bit estimator circuit 106. The sixteen binary outputs from the comparator circuits CPi are converted into a 4-bit value F1 by encoder 126. As shown in FIG. 1, the F1 value is stored in Latch 1 at the falling edge of the T2 signal, at the end of the first conversion cycle. The F1 value does not become available to other circuits in the ADC until the beginning of the second conversion cycle.

In all three conversion cycles, or flash steps, of the ADC, the same encoder circuit 126 is used. The encoder 126 can be viewed as outputting a 4-bit value representing the number of comparators which output a "0", or equivalently, as outputting a 4-bit value that represents the position in the chain of comparators at which the comparator outputs transition from a "0" to a "1".

Figure 5:
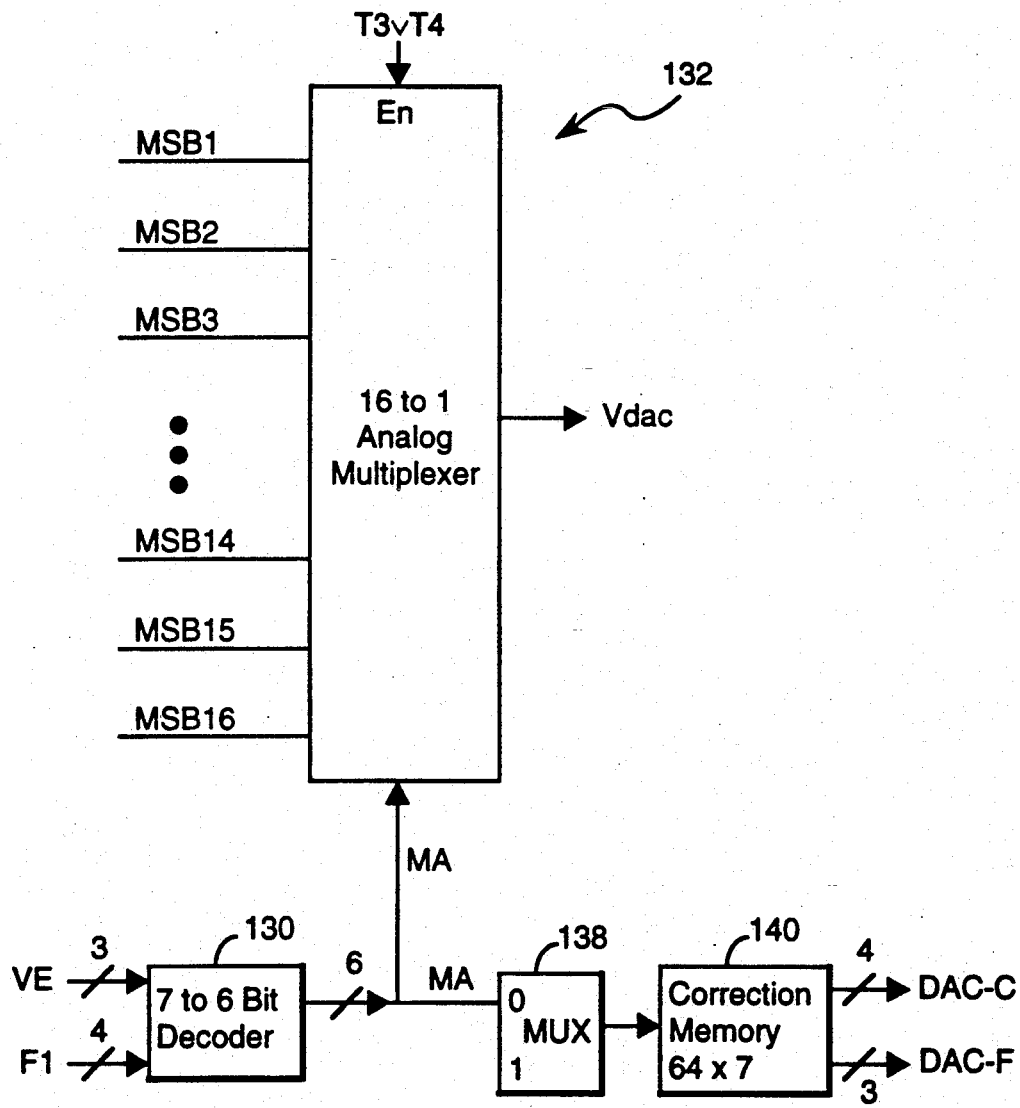
FIG. 5 is a block diagram of an analog-to-digital conversion circuit used in the ADC of FIG. 1 in its first conversion cycle.

Referring to FIGS. 1 and 5, the 3-bit estimated voltage range value VE and the 4-bit first conversion cycle value F1 are combined by encoder 130 to produce a six bit value MA. If the sixty four reference voltages obtained from the resistor ladder 124 are labelled Vref1 to Vref64, where Vref64 is equal to Vrefp, then the value MA represents the selection of the lowest reference voltage exceeding Vin. In the preferred embodiment, encoder 130 is implemented as a six-bit adder circuit that adds VE·$1000_2$+F1 (i.e., it adds VE, with three 0 bits concatenated to its least significant bit, to F1). Note that a subscript of "2" herein denotes a base 2 (i.e., binary) numeric value.

Second Conversion Cycle

In the second conversion cycle, the 6-bit MA value produced by the first conversion cycle is converted back into an analog signal Vdac and the input voltage Vin is subtracted from Vdac to generate a residual voltage Vres. The residual voltage Vres is then converted in the second ADC conversion cycle into a 4-bit digital value. As was explained above, the value of MA is selected to correspond to the lowest reference voltage that is greater than Vin, and therefore Vdac is known to be greater than Vin. As a result, it is guaranteed that the residual voltage Vres is positive (i.e., greater than Vrefn). Since the voltage step between neighboring tap points on the resistor ladder is Vrefp/64, it is also guaranteed that Vres has a magnitude no greater than one sixty-fourth of Vrefp (i.e., no greater than 64 LSB).

For example, if the input voltage Vin is equal to 120 LSB, then MA will be equal to 000001, Vdac will be equal to 128 LSB (after adjustment of correction voltages), and Vres will be equal to 8 LSB.

Conversion of the 6-bit MA value into an analog voltage signal Vdac is performed by an "inherent" digital-to-analog converter 132, which simply selects the reference voltage output by the resistor ladder 124 that corresponds to MA. As shown in FIG. 5, the digital-to-analog converter 132 is implemented in the preferred embodiment as a 16-to-1 analog multiplexer that outputs one of the MSB1 to MSB16 signals.

As mentioned in the background of the invention section of this document, the reference voltage produced by resistor ladder 124 may not be perfectly linear due to non-uniformities in the ladder's constituent resistors. For instance, if the reference voltage from the $i^{th}$ tap-point is too high by 5 millivolts, that will cause the residual voltage Vres metered in the second conversion cycle to be too high by 5 millivolts, thereby skewing the lower order bits of the generated conversion value Fout. In the present invention, the ADC includes "correction circuitry" for correcting each of the reference voltages produced by the resistor ladder 124 so that the effective tap-point reference voltages are linear to within 0.25 LSB (i.e., to within one quarter of the voltage swing associated with the least significant bit of Fout).

As shown in FIGS. 1 and 5, the MA value from the first conversion cycle passes through a multiplexer 138 to the address port of the ADC's embedded memory array 140, which then outputs two values DAC-C and DAC-F corresponding to the reference voltage Vdac selected by the first conversion cycle. In the preferred embodiment, memory array 140 contains an 64×7 array of EEPROM (electrically erasable read only memory) cells. The embedded memory array 140 is implemented using EEPROM cells so that the trim values stored therein can be revised after initially being set to default values of DAC-C(i)=$0000_2$ and DAC-F(i)=$000_2$, for i=0 to 63.

Figure 6:
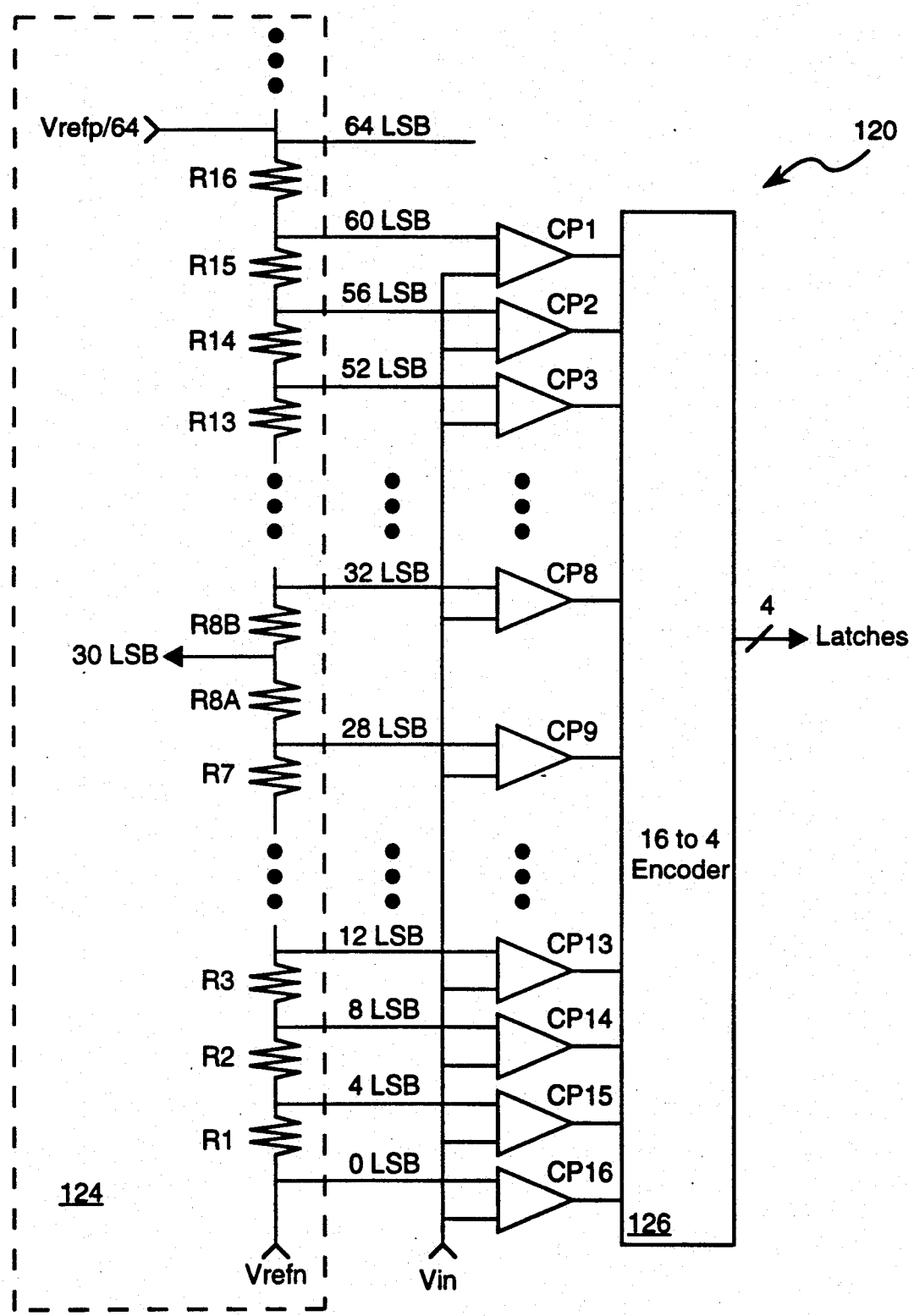
FIG. 6 depicts a 4-bit flash array circuit used in the ADC of FIG. 1 in its second conversion cycle.

Referring to FIGS. 4 and 6, the lowest resistor in the resistor ladder 124 shown in FIG. 4, which spans the voltage range from 0 to 64 LSB (i.e., Vrefp/64) is divided into sixteen smaller transistors R1 to R16 as shown in FIG. 6. In essense, this "LSB resistor ladder" can be considered to be connected in series with the "MSB resistor ladder" of FIG. 4. The second and third conversion cycles use only this bottom section of the resistor ladder 124 and only one sixty-fourth of the conversion voltage range. The sixteen comparators CP1 to CP16 compare the residual voltage Vres with sixteen of reference voltages produced at the LSB resistor ladder tap points, which range from 0 LSB to 64 LSB, in 4 LSB steps. These comparators CPi are the same as the set of comparators used in the first conversion cycle.

As shown in FIG. 6, the resistor ladder 124 is used in time period T1 to generate a reference voltage of 30 LSB for use in the comparators CP1 to CP16. Note that resistor R8 in the resistor ladder of FIG. 6 is implemented as two half-size resistors R8A and R8B to enable the generation of the 30 LSB reference voltage.

Note that the sequence of comparator circuits shown in FIG. 6 is "upside down" in terms of how the comparator outputs are decoded. That is, the F2 value generated during the second conversion cycle is equal to the number of comparators that output a "0" value, or alternately, F2 is equal to the index of the last comparator circuit, starting with CP1, to output a zero value.

Figure 7:
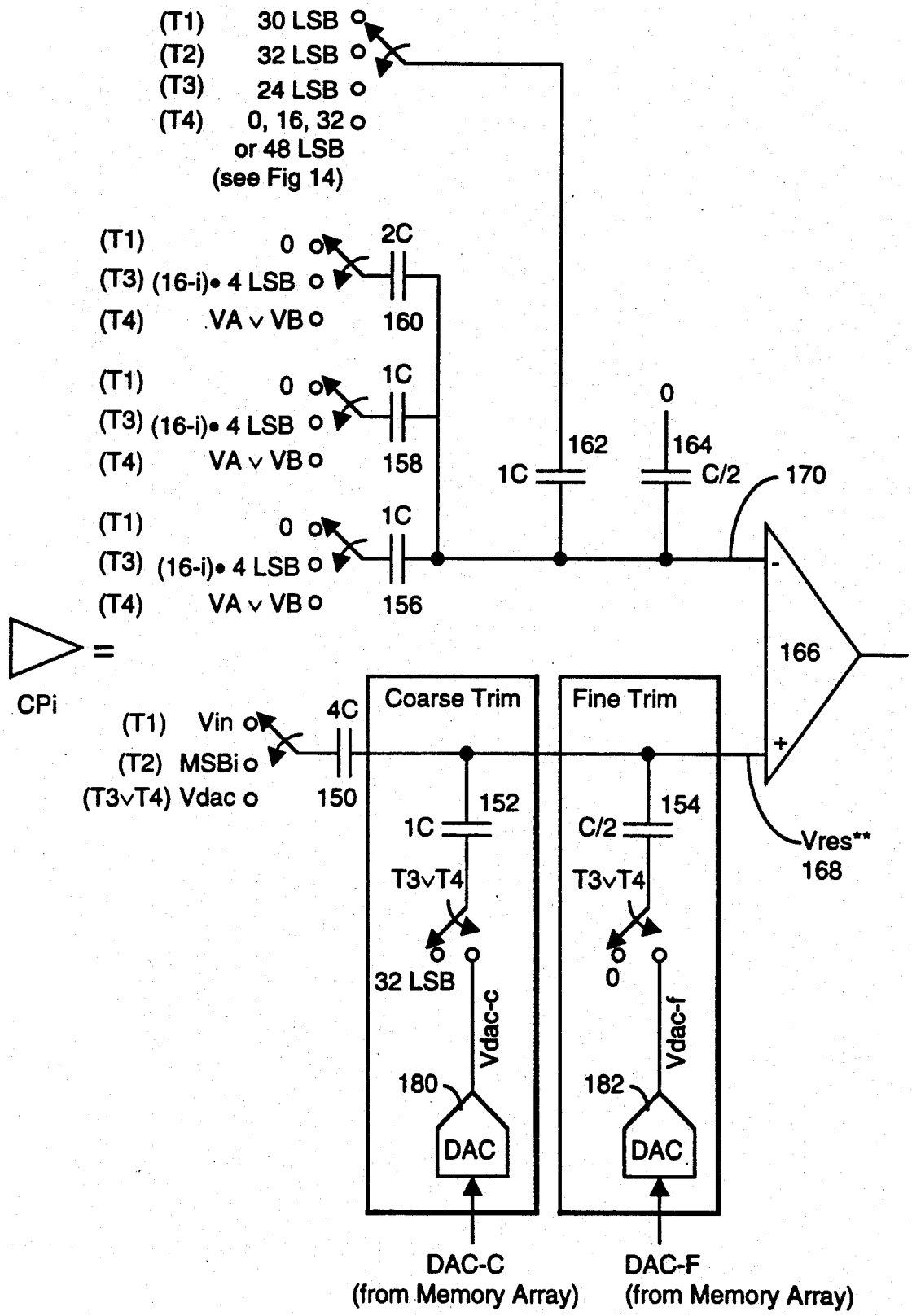
FIG. 7 is a detailed circuit diagram of one comparator used in the preferred embodiment, including the circuitry for compensating for resistor ladder non-uniformities.

Referring to FIG. 7, each comparator circuit CPi receives voltage signals via capacitive coupling through switched capacitors 150, 152, 154, 156, 158, 160, 162, 164. When the ADC starts each conversion cycle, reset circuitry (not shown) on the comparator 166 resets the voltage on its two input nodes 168 and 170 to precisely the same voltage (e.g., the circuit's ground voltage) so that the comparator is set to its trip point. Also during this time, the plate of each switched capacitor opposite the input nodes is set to an initial voltage level, indicated in FIG. 7 by the label "(T1)". More particularly, the switched plate of capacitor 150 is set to Vin during T1, the switched plate of capacitor 152 is set to 32 LSB during T1, the switched plate of capacitor 162 is set to 30 LSB during T1, and the switched plate of all the other switched capacitors in FIG. 7 are set to 0 volts (actually Vrefn).

During the first conversion cycle, while T2 is active, capacitor 150 is switched from Vin to MSBi, thereby putting a voltage on node 168 which is proportional to MSBi−Vin. Thus, those comparators receiving a positive voltage on node 168 will produce one output while the other comparators will produce the opposite output.

During the second conversion cycle, the residual voltage Vres is generated at time T3 on node 168 by switching capacitor 150 from the Vin voltage level to the Vdac voltage level, causing a voltage level corresponding to the voltage difference between those two voltages to capacitively transferred onto node 168.

$$Vres = Vdac - Vin$$

In addition, capacitors 152 and 154 capacitively transfer onto node 168 two correction voltages. As shown in FIG. 8, the DAC-C value read from memory 140 is converted into an analog voltage Vdac-c, using an "inherent DAC" 180 implemented in the preferred embodiment as a 16-to-1 analog multiplexer that outputs one of the reference voltages between 0 LSB and 60 LSB. Since the corresponding capacitor 152 is one fourth the size of capacitor 150, and because capacitor 152 is initialized at T1 to a voltage of 32 LSB, when Vdac-c is less than 32 LSB the coarse correction on node 168 is negative. Table 1 shows the association between correction values for DAC-C, the resulting Vdac-c value, and the trim applied to node 168.

TABLE 1

COARSE TRIM OF RESISTOR LADDER

| DAC-C | Vdac-c | Coarse Trim to Node 168 |
| --- | --- | --- |
| 0111 | 4 LSB | −7 LSB |
| 0110 | 8 LSB | −6 LSB |
| 0101 | 12 LSB | −5 LSB |
| 0100 | 16 LSB | −4 LSB |
| 0011 | 20 LSB | −3 LSB |
| 0010 | 24 LSB | −2 LSB |
| 0001 | 28 LSB | −1 LSB |
| 0000 | 32 LSB | 0 LSB |
| 1000 | 36 LSB | +1 LSB |
| 1001 | 40 LSB | +2 LSB |
| 1011 | 44 LSB | +3 LSB |
| 1010 | 48 LSB | +4 LSB |
| 1100 | 52 LSB | +5 LSB |
| 1101 | 56 LSB | +6 LSB |
| 1110 | 60 LSB | +7 LSB |
| 1111 | 64 LSB | +8 LSB |

Referring to FIG. 9, the fine trim value DAC-F value read from memory 140 is converted into an analog voltage Vdac-f using another "inherent DAC" 182 implemented in the preferred embodiment as a 8-to-1 analog multiplexer that outputs one of the reference voltages between 0 LSB and 14 LSB. Note that the bottom four resistors of the resistor ladder are each implemented as two half-size resistors to enable the generation of reference voltages in 2 LSB steps. Also, the corresponding capacitor 152 (see FIG. 7) is one eighth the size of capacitor 150, and capacitor 152 is initialized at T1 to a voltage of 0 volts. Table 2 shows the association between correction values for DAC-F, the resulting Vdac-f value, and the trim applied to node 168.

TABLE 2

FINE TRIM OF RESISTOR LADDER

| DAC-F | Vdac-f | Fine Trim to Node 168 |
| --- | --- | --- |
| 000 | 0 LSB | +0.00 LSB |
| 001 | 2 LSB | +0.25 LSB |
| 010 | 4 LSB | +0.50 LSB |
| 011 | 6 LSB | +0.75 LSB |
| 100 | 8 LSB | +1.00 LSB |
| 101 | 10 LSB | +1.25 LSB |
| 110 | 12 LSB | +1.50 LSB |
| 111 | 14 LSB | +1.75 LSB |

Thus, the corrected residual voltage Vres** on node 168 is defined as:

$$Vres^{**} = Vdac - Vin + (Vdac\text{-}c - 32LSB)/4 + Vdac\text{-}f/8$$

Referring again to FIG. 7, all three capacitors 156, 158 and 160, which together have capacitance equal to that of capacitor 150, are switched from 0 volts to a voltage equal to $(16-i) \cdot 4$ LSB at time T3. Thus, for comparator CP1, these capacitors are switched from 0 volts to 60 LSB, while for comparator CP1 these capacitors are switched from 0 volts to 0 LSB.

A 1.5 LSB offset is generated on node 170 by stitching capacitor 162 from 30 LSB at T1 to 24 LSB at T3 (i.e., $(30-24)LSB/4 = -1.5$ LSB). As a result, each comparator circuit CPi performs the following comparison:

$$Vres^{**} > (16-i) \cdot 4LSB - 1.5LSB$$

The comparison voltages on node 170 for the sixteen comparators CP1 to CP16 range from 58.5 LSB (for CP1) to −1.5 LSB (for CP16). The reason that the comparison voltages decrease as one goes from lower to higher comparators is that Vres decreases as Vin increases (until Vres "wraps" back around to 64 LSB). Thus, for a given MA value, as Vin increases (a Vres decreases), the first comparator CPi to output a "1" will move upwards to larger values of i, and thus the number of comparators to output a "0" increases.

For example, consider the operation of the second conversion cycle when input voltage Vin is equal to 123.2 LSB. MA will be equal to 000001, Vdac will be equal to 128 LSB (after adjustment of correction voltages), and Vres will be equal to 4.8 LSB. In this example, comparators CP1 to CP14 (with comparison voltages ranging from 58.5 LSB to 6.5 LSB) will each output "0" and comparators CP-15 to CP-16 (with comparison voltages ranging form 2.5 LSB to −1.5 LSB) will each output "1". Therefore, the F2 value generated by the second conversion cycle will be equal to 1110 (i.e., $14_{10}$).

Note that the 1.5 LSB offset in the above equation is actually a 2 LSB offset from the trip point voltage, which would otherwise range from 60.5 LSB to 0.5 LSB for CP1 to CP16, respectively. For certain input voltages, this 2 LSB offset causes the F2 value generated to be smaller by 1 (i.e., 4 LSB) than if the actual trip point voltages were used. For instance, an input voltage Vin of 120 LSB, will produce a Vres value of 8 LSB, and an F2 value of 1101 (i.e., $13_{10}$) instead of 1110 (i.e., $14_{10}$). As will be discussed below, the third conversion cycle adjusts the ten bit value MA || f2 (where " || " indicates concatenation of the bits values on either side of this symbol) generated by the first two conversion cycles for the +2 LSB offset in the second conversion cycle.

Referring to FIG. 6, the sixteen binary outputs from the comparator circuits Cpi are converted into a 4-bit value by encoder 126. As shown in FIG. 1, the decoded value is stored in Latch 2 at the falling edge of the T3 signal, at the end of the second conversion cycle, with the output of Latch 2 being labelled F2.

Thus, at the end of the second ADC conversion cycle the ADC circuit has produces a 10-bit value, comprising the 6-bit MA value and the 4-bit F2 value.

During the third ADC conversion cycle, two additional bits are generated using a "parallel successive approximation" circuit, which will be described below.

Procedure for Testing ADC and Generating Coarse and Fine Trim Values

Figure 10:
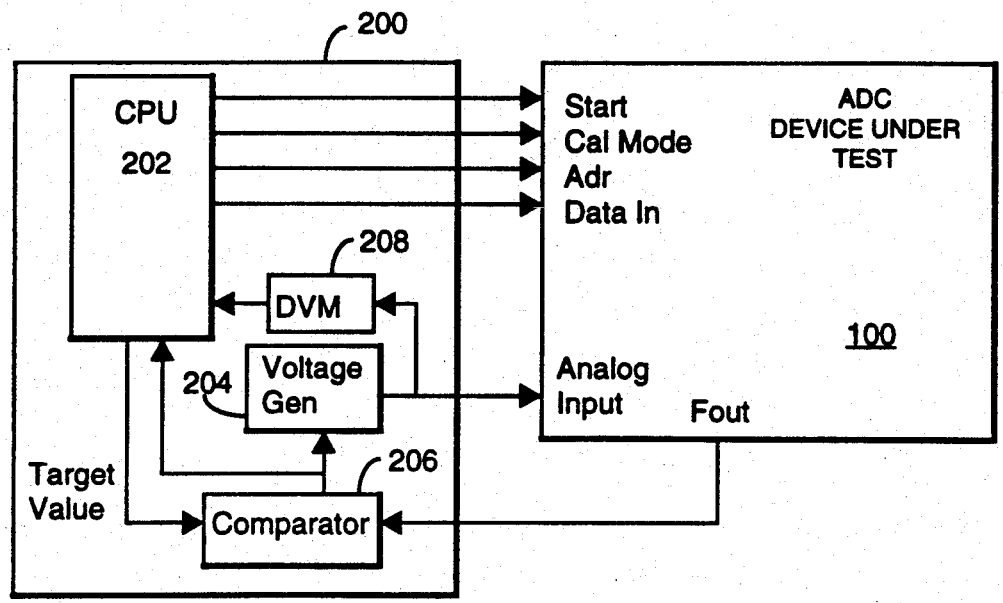
FIG. 10 shows a system for testing the linearity of the resistor ladder in an ADC and for storing correction values in a memory array embedded in the ADC.
Figure 11:
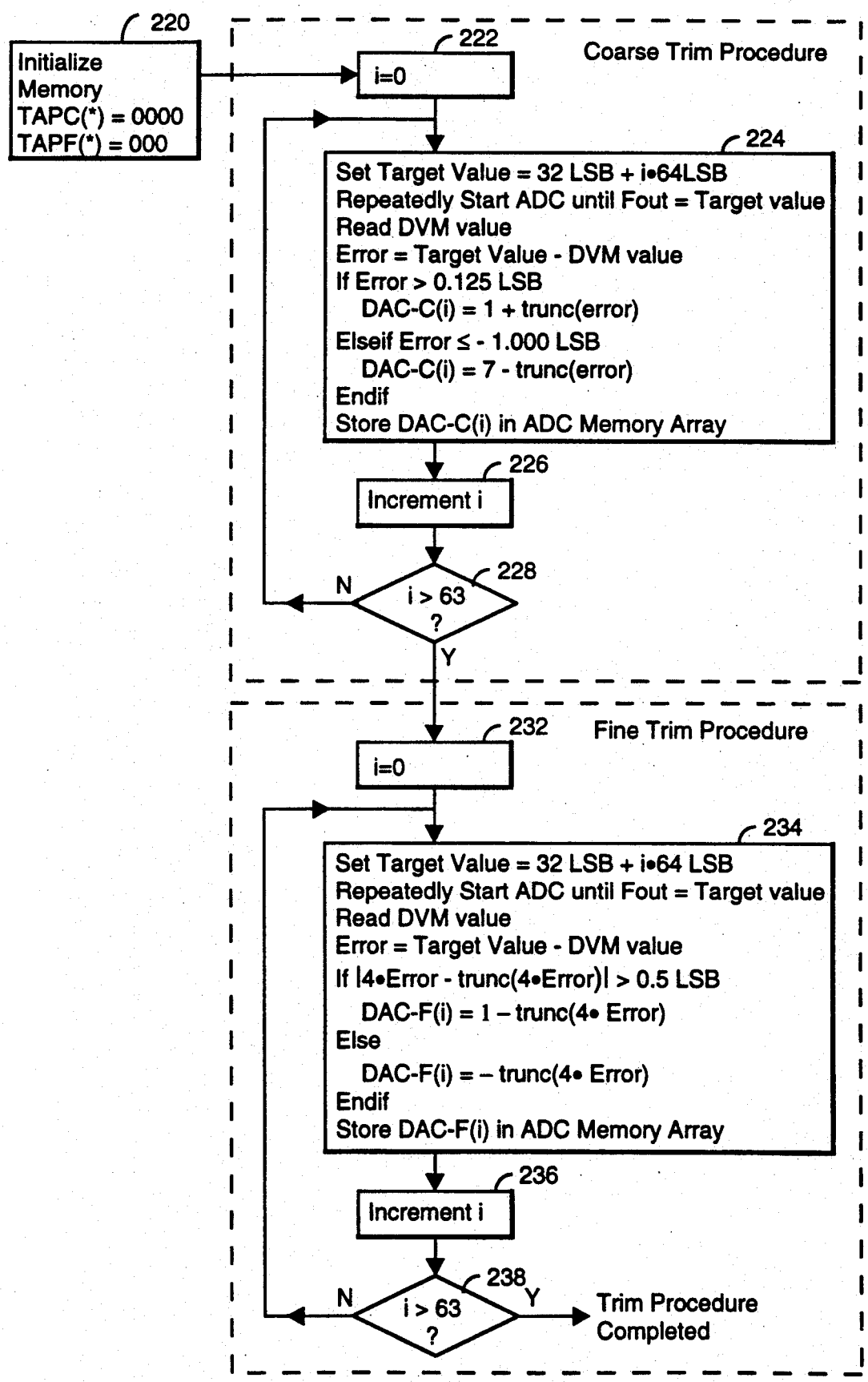
FIG. 11 is a flow chart of a preferred testing procedure for determining the correction values to be stored in the memory array embedded in the ADC.

Referring to FIG. 10, each ADC 100 manufactured is tested and its resistor ladder 124 is "trimmed" using a test system 200 having a data processor (CPU) 202 that is programmed to perform the procedure shown in FIG. 11. The test system also has a voltage generator 204 that increases its output voltage whenever comparator 206 outputs a positive voltage, decreases its output voltage when comparator 206 outputs a negative voltage, and maintains a constant output voltage when comparator output a zero voltage. Comparator 206 compares the values of a 12-bit Target Value generated by CPU 202 and the 12-bit Fout value generated by ADC 100 and outputs a positive voltage when the Target Value is greater than or equal to Fout, a negative voltage when the Target Value is less than Fout. In some test systems, comparator 206 is digital subtraction circuit that subtracts Fout from Target Value and outputs a digital value instead of an analog voltage. Digital volt meter (DVM) 208 precisely measures the voltage generated by the voltage generator 204 with a precision at least eight times greater than the least significant bit of the ADC 100.

Referring to FIG. 11, the first step 220 of the testing and trimming procedure is to initialize the memory array 140 so that the trim values stored therein are default values of DAC-C(i)=$0000_2$ and DAC-F(i)=$000_2$, for i=0 to 63. Referring to FIGS. 7, 8 and 9, it can be seen that these values are selected so that the coarse and fine trim circuits do not affect the value of Vres** on node 168. The storage of values in the memory array 202 is performed by the CPU by setting the ADC's mode to "calibrate", transmitting a sequence of address values CA for addressing the memory array 140, and for each memory array address storing the default DAC-C and DAC-F values (see FIG. 1).

Next, the coarse trim procedure is performed by the CPU 202, the first step of which is to set an index value i to zero (step 222). Then for each value of i, step 224 is performed. In step 224 a Target Value is computed and transmitted to comparator 206. The Target Value is set to middle of the Fout range associated with the top six bits (MA) of Fout being equal to i. Thus, the Target Value is equal to 32 for MA=0, 96 for MA=1, and so on.

Typically, the test voltage output by the voltage generator 204 slews to the trip point at which Fout oscillates between the Target Value and the Target Value minus 1 within a few tens of milliseconds (i.e., within a few thousand ADC conversion cycles), and then oscillates within a very tight around the trip point. The CPU 202 then samples the digital value output by the DVM several (e.g., ten) times when the comparator output indicates that Vin has just increased from being below the trip point to above or at the trip point, and those samples are averaged to produce a value representing the "DVM value" corresponding to the specified Target Value. Thus, the DVM value computed by the CPU 202 represents the lowest Vin voltage associated with each targeted Fout value.

Based on the computed DVM value, and an error value is computed $$\text{Error} = (\text{Target Value} - DVM \text{ value})/(1 \ LSB \text{ of } ADC)$$

so that Error is measured in units of the ADC's LSB. The DVM value represents the true voltage that was metered by the ADC 100. If the Error is positive, that means the ADC generated an Fout value that is too high for the input voltage applied, DVM. It can be seen from FIG. 7 that this means Vres** was too high, which means that Vdac was too high. If the Error is negative, Vdac was too low.

DAC-C is set for each tap point i so that the resulting Vres value (ignoring the fine trim circuit contribution) will fall between −1.000 LSB and +0.125 LSB. This range is selected because the fine trim circuit can increase Vres by amounts ranging from +0.25 LSB to +1.75 LSB, but cannot decrease Vres**. Thus, referring to Table 1, if Error is positive and greater than 0.125 LSB, then DAC-C is set as follows:

$DAC-C = 1 +$ the integer portion of Error (when Error $>$ 0.125 $LSB$)

If Error is less than or equal to −1.000 LSB, DAC-C is set as follows:

$DAC-C = 7 -$ the integer portion of Error (when Error $\leq$ −1.000 $LSB$)

If Error falls in the range −1.000 LSB to 0.125 LSB, DAC-C(i) is left unchanged at 0000. For instance, if Error = −3.7 LSB, then DAC-C is set 7+3, which is equal to $10_{10}$, or $1010_2$ in binary form, which will cause a coarse trim adjustment of +3 LSB to node 168. The computed DAC-C(i) value is stored in the embedded memory array.

Then the index i is incremented (step 226) and steps 222, 224 and 226 are repeated until i exceeds 63 (step 228), at which point the coarse trim procedure is complete.

Next, after all the coarse trim value DAC-C have been loaded into the ADC's embedded memory 140, the fine trim procedure is performed by the CPU 202, the first step of which is to reset the index value i to zero (step 232). Then for each value of i, step 234 is performed. In step 234 a Target Value is computed and transmitted to comparator 206. As in step 224, the Target Value is set to middle of the Fout range associated with the top six bits (MA) of Fout being equal to i. When the asserted test voltage reaches the trip point of the ADC, the CPU 202 samples the DVM value several times, averages the sampled DVM values, and computes an error value:

$$\text{Error} = (\text{Target Value} - DVM \text{ value})/(1 \ LSB \text{ of } ADC)$$

so that Error is measured in units of the ADC's LSB.

Although this is not shown in the flow chart, if the computed Error is positive and greater than 0.125 LSB, then the coarse trim value DAC-C(i) loaded into the memory 140 needs to be revised. In particular, the coarse trim value DAC-C(i) is decreased by 1 for DAC-C values above 8, increased by one for DAC-C values below 8, and changed to a value of 0 when DAC-C equals 8. Then the fine trim procedure for i is restarted.

Generally, the Error value should be negative or less than 0.125 LSB. The fine trim procedure is designed to adjust Vres to within 0.125 LSB of its ideal value. Thus, DAC-F is set for each tap point i so that the resulting Vres value will fall between −0.125 LSB and +0.125 LSB. To accomplish this, DAC-F is set equal to the integer portion of −4·Error, but if the fractional part of −4·Error is greater than 0.5, then DAC-F is rounded up to the next largest value. For instance, if Error = −0.7 LSB, in which case −4·Error equals 2.8, then DAC-F is set to $3_{10}$, or $011_2$ in binary form. If Error=−0.3 LSB, in which case −4·Error equals 1.2, then DAC-F is set to a value of 1. The computed DAC-F(i) value is stored in the embedded memory array 140.

Then the index i is incremented (step 236) and steps 232, 234 and 236 are repeated until i exceeds 63 (step 238), at which point the fine trim procedure is complete.

Third ADC Conversion Cycle Using Parallel Successive Approximation Technique The third ADC conversion cycle has two purposes: (1) generating the two least significant bits of the Fout value, and (2) recovery of errors of up to ±6 LSB in the first ten bits of the Fout value. Furthermore, the third ADC conversion step is performed using the above-described "inherent DAC" conversion technique, as well as binary weighted switch capacitors to avoid use of an additional resistor ladder.

As mentioned above, the raw, uncorrected reference voltages from the MSB resistor ladder can be off by as much as ±6 LSB. As a result, the 6-bit MA value from the first conversion cycle will, for some input voltages, be off by ±1. This, in turn, will cause the residual voltage Vres** to be outside the 0 to 64 LSB range, and therefore the results of the second conversion cycle will be 0000 or 1111, depending on which way MA was off. In these instances, the third conversion cycle both resolves the two least significant bits of Fout and also adjusts the 10 most significant bits.

Therefore the third conversion cycle must produce an "offset" or "recovery" value that can be used to adjust the first ten bits produced by the first two conversion cycles.

Referring to FIGS. 12 and 13, the F2 value from the second ADC conversion step is converted into two analog voltages by an "inherent" digital-to-analog converter 252 implemented in the preferred embodiment as a 17-to-2 analog multiplexer (or two 16-to-1 analog multiplexers) that outputs the closest reference voltages VA and VB below and above the residual voltage Vres on node 168 of the comparators CPi. For instance, if Vres is equal to 9 LSB, then VA and VB will be 8 LSB and 12 LSB, respectively. The VA and VB voltages represent the first ten bits of the converted voltage value Fout.

In order to divide the 4 LSB voltage range between VA and VB into four equal voltage ranges, a parallel successive approximation technique is used. FIG. 7 shows the circuitry of one of the sixteen comparator CPi provided by the 4-bit flash array 120 (see FIG. 1). In the third conversion step, during time T4, the switched capacitors 156, 158, 160 are each switched to either VA or VB, and switched capacitor 162 is switched from a voltage of 30 LSB to one of 0, 16, 32 or 48 LSB, as will be explained below. In all of the comparators, the trimmed residual voltage Vres on node 168** is left unchanged from the previous conversion step.

Figure 14:
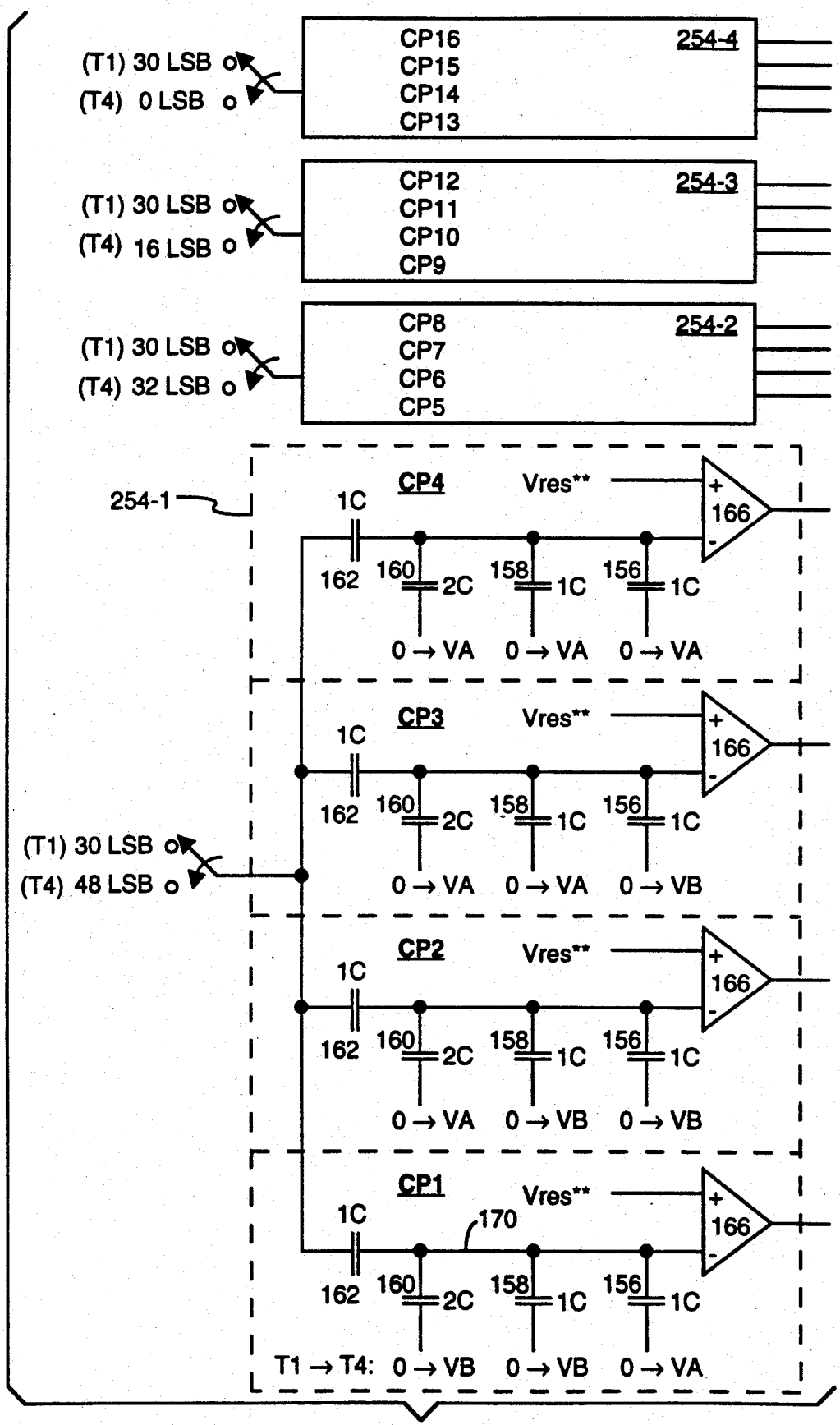
FIG. 14 depicts a portion of the parallel successive approximation circuit used in the third conversion cycle of the ADC of FIG. 1.

The circuit shown in FIG. 14 is herein called a "parallel successive approximation register" (SAR). By selectively switching combinations of VA and VB with binary weighted capacitors, sub-divisions of voltages between VA and VB are generated on node 170 of each comparator. For example, switching a 1C capacitor to VB and a 2C capacitor to VA is equivalent to:

$$\frac{VB + 3VA}{4} = VA + 1\ LSB$$

where 1 LSB=0.25·(VB−VA) since 1 LSB is one fourth of the voltage drop from VB to VA. Thus, in the first bank 254-1 of four comparators, the voltages generated by capacitors 156, 158 and 160 are as follows:

CP4: VA

CP3: VA+1 LSB

CP2: VA+2 LSB

CP1: VA+3 LSB

The exact same circuitry is repeated in comparator banks 254-2, 254-3 and 254-4 for comparators CP5 through CP16.

Each of the comparator banks has a different offset voltage provided by switched capacitor 162. In particular, bank 254-4 has an offset voltage of −7.5 LSB (i.e., (0−30 LSB)/4), while bank 254-3 has an offset voltage of −3.5 LSB, bank 254-2 has an offset voltage of +0.5 LSB nad bank 254-1 has an offset voltage of +4.5 LSB. Table 3 lists the net comparison voltage produced on node 170 of each of the sixteen capacitors, showing the resulting comparison with Vres, and also shows how Vres voltages falling between each of the comparator trip points are encoded as a 4-bit value F3.

TABLE 3

| | SUCCESSIVE APPROXIMATION REGISTER COMPARISON VOLTAGES | | |
|---|---|---|---|
| Comprtr ID | SAR Comparison Performed | F3 F3 A B | Adjustment to MA \|\| F2 \|\| F3B |
| CP16 | Vres** > VA − 7.5 LSB | 11 11 | +8 |
| CP15 | Vres** > VA − 6.5 LSB | 11 10 | +8 |
| CP14 | Vres** > VA − 5.5 LSB | 11 01 | +8 |
| CP13 | Vres** > VA − 4.5 LSB | 11 00 | +8 |
| CP12 | Vres** > VA − 3.5 LSB | 10 11 | +4 |
| CP11 | Vres** > VA − 2.5 LSB | 10 10 | +4 |
| CP10 | Vres** > VA − 1.5 LSB | 10 01 | +4 |
| CP9 | Vres** > VA − 0.5 LSB | 10 00 | +4 |
| CP8 | Vres** > VA + 0.5 LSB | 01 11 | 0 |
| CP7 | Vres** > VA + 1.5 LSB | 01 10 | 0 |
| CP6 | Vres** > VA + 2.5 LSB | 01 01 | 0 |
| CP5 | Vres** > VA + 3.5 LSB | 01 00 | 0 |
| CP4 | Vres** > VA + 4.5 LSB | 00 11 | −4 |
| CP3 | Vres** > VA + 5.5 LSB | 00 10 | −4 |
| CP2 | Vres** > VA + 6.5 LSB | 00 01 | −4 |
| CP1 | Vres** > VA + 7.5 LSB | 00 00 | −4 |

Referring to FIGS. 1 and 6, the outputs of the comparators are encoded as a four bit value by encoder 126 (which is the same encoder as used for the first and second conversion steps), whose output is latched into Latch3 at the end of T4. The output of Latch3 is labelled F3. In Table 3 the F3 value is divided into two 2-bit values, F3A and F3B. The 2-bit F3B value becomes the two least significant bits of Fout. The 2-bit F3A value determines the amount by which the first ten bits formed by concatenating MA and F2 are to be adjusted, where the amount of adjustment is selected from +2, 1, 0, and −1, corresponding to adjustments of +8 LSB, +4 LSB, 0 LSB and −4 LSB to the value represented by MA \|\| F2 \|\| F3B.

Figure 15:
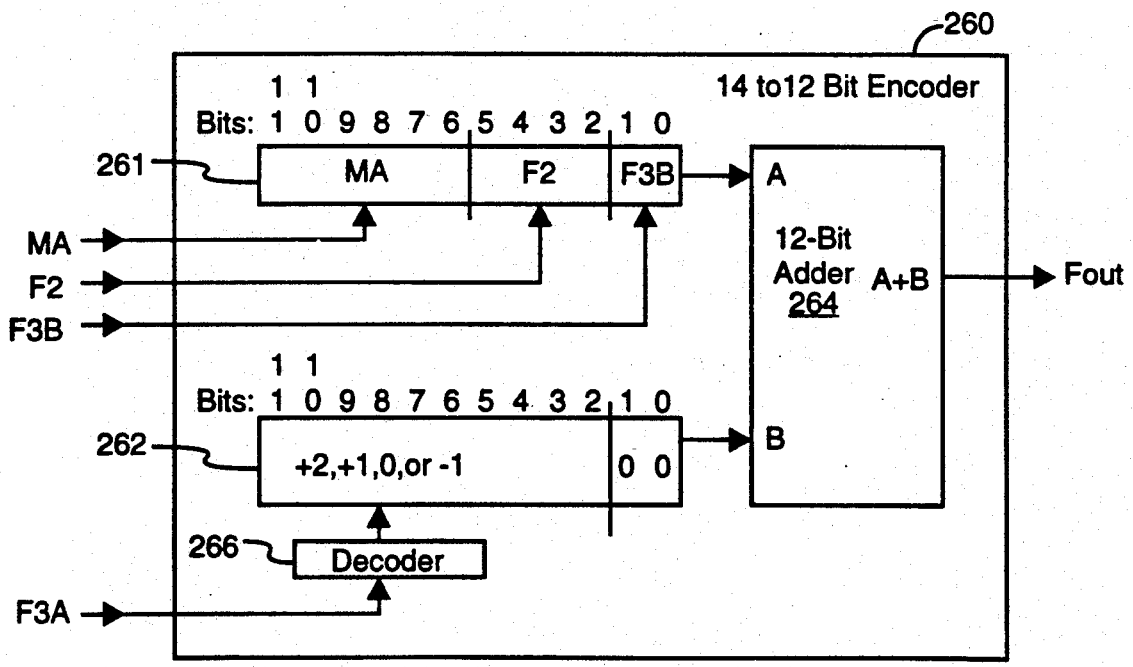
FIG. 15 is a block diagram of the digital correction circuit for combining the results of the third conversion cycle of the ADC with the results from the first two conversion cycles.

Referring to FIG. 15, a 12-bit encoder circuit 260 generates the ADC output value Fout by generating two input values, represented by registers 261 and 262, that are then added to each other by an adder circuit 264 to produce Fout. In the encoder, the MA, F2 and F3B values are concatenated to generate a first 12-bit value MA || F2 || F3B labelled 261. The 2-bit F3A value is converted by decoder 266 into signals representing +8, +4, 0 or −4, (or equivalently, 2, 1, or −1, followed by two "0" bits). Then the two 12-bit values 261 and 262 are then added using a 12-bit added 266 to produce Fout.

To further demonstrate the operation of the second and third conversion cycles, Table 4 shows the values of F2 and F3 generated for a representative set of input voltages between 117.1 and 127.1 LSB, all of which should have the same MA value of 000001. Table 4 assumes that the 128 LSB tap point of the resistor ladder is off by 2.5 LSB, producing a comparison voltage of 125.5 LSB. Therefore the MA value obtained from the first conversion cycle is correct for the input voltages between 117.1 and 125.1 LSB, but is incorrect for the input voltages 126.1 and 127.1 LSB. It is also assumed that the 128 LSB reference voltage produced by the resistor ladder is corrected to within 0.125 LSB by the correction circuitry of the present invention. As shown, under those circumstances, the "SAR circuit" produces only four of the sixteen possible output values for F3 when the MA value obtained from the first conversion cycle is correct, and outputs F3 values in a second range when the MA value output by the first conversion cycle is too high by 1.

TABLE 4
EXAMPLES OF F3 VALUES GENERATED BY SUCCESSIVE APPROXIMATION REGISTER

| Vin | Vres** | F2 | VA | F3 |
|---|---|---|---|---|
| Examples with Incorrect MA value (e.g., 000010) caused by second tap voltage being too low (e.g., 125.5 LSB instead of 128 LSB), but trimmed to correct value in second and third conversion cycles by correction circuitry: | | | | |
| 127.1 LSB | 64.9 LSB | 0000 | 60 LSB | 00 11 |
| 126.1 LSB | 65.9 LSB | 0000 | 60 LSB | 00 10 |
| Examples with Correct MA value of 000001: | | | | |
| 125.1 LSB | 2.9 LSB | 1110 | 4 LSB | 10 01 |
| 124.1 LSB | 3.9 LSB | 1110 | 4 LSB | 10 00 |
| 123.1 LSB | 4.9 LSB | 1110 | 4 LSB | 01 11 |
| 122.1 LSB | 5.9 LSB | 1110 | 4 LSB | 01 10 |
| 121.1 LSB | 6.9 LSB | 1101 | 8 LSB | 10 01 |
| 120.1 LSB | 7.9 LSB | 1101 | 8 LSB | 10 00 |
| 119.1 LSB | 8.9 LSB | 1101 | 8 LSB | 01 11 |
| 118.1 LSB | 9.9 LSB | 1101 | 8 LSB | 01 10 |
| 117.1 LSB | 10.9 LSB | 1100 | 12 LSB | 10 01 |

The parallel successive approximation register technique of the present invention can be used to extend the precision of vitually any resistor ladder based ADC from N bits to N+J bits, where N will generally be an integer ≧5, and J will generally be an integer ≧1. Generally, the ADC will produce a first conversion value CV1 based on comparison of the input voltage, or voltages derived from the input voltage, with the reference voltages from the resistor ladder. The resolution of the first conversion value will generally match that of the resistor ladder reference voltages, and can be represented as $2^j$ LSB, where 1 LSB is the resolution of the N+J-bit output value generated by the ADC. The SAR technique extends the resolution of the initially generated conversion value by J bits by (A) selecting a reference voltage corresponding to the initially generated conversion value, (B) using a set of parallel switched capacitor circuits to generate a set of comparison voltages stepped in 1 LSB increments, (C) comparing the input voltage or a voltage derived therefrom with the comparison voltages, and (D) encoding the resulting comparison signals to generate a second conversion value CV2, that is combined with the first conversion value to generate the ADC output value.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

For instance, the size of the memory array 140 could be reduced by a factor of two or more by basing the correction voltages on a smaller number of the most significant bits from the initial conversion value MA. For example, the correction values DAC-C and DAC-F could be based on just the five most significant bits of the 6-bit MA value. While a certain amount of trimming accuracy would be lost, many of the benefits of the invention would be retained.

Another alternate embodiment breaks the second conversion step into two phases. During a first phase Vres is generated, as explained above, and the outputs of the top and bottom comparators CP16 and CP1 are checked to see if the Vres voltage is below 0 LSB or above 64 LSB. Furthermore, the MA value from the first conversion cycle would be stored in a counter so that if can be easily incremented or decremented. If Vres is above 64 LSB, then MA is decreased in value by 1, and if Vres is below 0 LSB then MA is increased in value by 1. The revised MA value causes the Vdac voltage to change, which in turn changes the Vres** value by 64 LSB. Then the second phase of the second conversion cycle is performed, during which the outputs from all sixteen comparators are encoded to generate F2. Furthermore, the trip points for the comparators in the second conversion cycle would be changed from the above described preferred embodiment to eliminate the 2 LSB offset, so that the comparison voltages would range from 0.5 to 60.5 LSB. While this alternate embodiment requires a longer second conversion cycle, one advantage of this alternate embodiment is that the third conversion cycle does not need to correct for errors in the first two conversion steps, and thus only needs to generate the least two significant bits.

What is claimed is:

1. An analog-to-digital converter, comprising:
an input circuit that receives an input signal having an input voltage;
a resistor ladder circuit that generates a sequence of N stepped reference voltages, where N is an integer larger than four;
M comparator circuits that simultaneously compare said input voltage with M of said N stepped reference voltages and generate M binary comparison signals, wherein M≦N and said M comparator circuits are coupled to said input circuit and said resistor ladder;
a digital encoder, coupled to said M comparator circuits, that encodes said M binary comparison signals to generate a multiple-bit first digital conversion value;
a programmable memory that stores a multiplicity of digital correction values, wherein said programmable memory is addressed by at least a subset of said first digital conversion value's most significant bits and outputs a corresponding one of said multiplicity of digital correction values;

a digital-to-analog converter that converts said digital correction value output by said programmable memory into an analog correction voltage;

a circuit for generating a residual voltage corresponding to a selected one of said N stepped reference voltages, corresponding to said first digital conversion value, minus said input voltage, plus an offset voltage proportional to said analog correction voltage; and means for converting said residual voltage into a second digital conversion value.

2. The analog-to-digital converter of claim 1, said analog-to-digital converter comprising a single semiconductor integrated circuit;

said M comparator circuits including means for comparing said residual voltage with a second sequence of stepped reference voltages to generate a second set of M binary comparison signals; and said residual voltage converting means including control circuitry coupled to said M comparator circuits and to said digital encoder, said control circuitry prompting said digital encoder to encode said second set of M binary comparison signals to generate said second digital conversion value.

3. An analog-to-digital converter, comprising:

an input circuit that samples an input voltage signal;

a resistor ladder having a multiplicity of resistors serially connected between first and second voltage supply nodes, said resistor ladder including N tap points at which N stepped reference voltages are generated, where N is an integer larger than four;

M comparator circuits, coupled to said input circuit and said resistor ladder, where M≦N, each comparator circuit having two input nodes including a first input node on which a voltage signal corresponding to said input voltage signal is asserted; said M comparator circuits comparing said asserted voltage signal with M of said N stepped reference voltages and generating a corresponding set of M binary comparison signals;

a digital encoder that encodes said M binary comparison signals to generate an X-bit initial digital conversion value, where X is at an integer greater than three;

a programmable memory that which stores a multiplicity of digital correction values, wherein said programmable memory is addressed by at least a subset of said X-bit initial digital conversion value's most significant bits and outputs a corresponding one of said multiplicity of digital correction values;

a digital-to-analog converter that converts said digital correction value output by said programmable memory into an analog correction voltage;

a voltage adjustment circuit for adjusting a predefined voltage by an offset voltage proportional to said analog correction voltage, wherein said predefined voltage is selected from the set consisting of (A) said input voltage, (B) one of said N stepped reference voltages selected in accordance with said initial digital conversion value, and (C) a combination of said input voltage and said selected one of said N stepped reference voltages; and means for generating a second digital conversion value in accordance with said adjusted predefined voltage.

4. The analog-to-digital converter of claim 3, wherein said voltage adjustment circuit generates a residual voltage corresponding to a selected one of said N stepped reference voltages, corresponding to said initial digital conversion value, minus said input voltage, plus an offset voltage proportional to said analog correction voltage; and said generating means including means for converting said residual voltage into a second digital conversion value.

5. The analog-to-digital converter of claim 3, wherein said voltage adjustment circuit includes coupled switched capacitors for generating a voltage comprising a predefined combination of said input voltage, said selected one of said N stepped reference voltages, and said analog correction voltage.

6. A method of metering an analog input signal's voltage so as to generate a digital output signal, said the steps of the method comprising:

storing in a digital memory circuit a multiplicity of digital correction values, each digital correction value corresponding to at least one reference voltage in a predefined set of reference voltages;

receiving an input signal having an input voltage;

comparing said input voltage with at least a first subset of said predefined set of reference voltages to produce a first set of comparison signals;

encoding said first set of comparison signals to generate a first digital conversion value having multiple bits;

retrieving from said digital memory circuit one of said digital correction values in accordance with said first digital conversion value having multiple bits;

converting said retrieved digital correction value into an analog correction voltage;

comparing said input voltage with at least a second subset of said predefined set of reference voltages, adjusted by an offset voltage proportional to said analog correction voltage, to produce a second set of comparison signals; and encoding said second set of comparison signals to generate a second digital conversion value.

7. The method of claim 6, said second comparing step including:

generating a residual voltage corresponding to a selected one of said predefined set of reference voltages, corresponding to said first digital conversion value, minus said input voltage, plus an offset voltage proportional to said analog correction voltage; and comparing said residual voltage with at least said second subset of said predefined set of reference voltages to produce said second set of comparison signals.

* * * * *